US008862956B2

United States Patent
Huang et al.

(10) Patent No.: US 8,862,956 B2
(45) Date of Patent: Oct. 14, 2014

(54) COMPOUND HOLD-TIME FAULT DIAGNOSIS

(75) Inventors: Yu Huang, Sudbury, MA (US); Wu-Tung Cheng, Lake Oswego, OR (US); Ting-Pu Tai, Taipei (TW); Liyang Lai, Wilsonville, OR (US); Ruifeng Guo, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 265 days.

(21) Appl. No.: 13/397,594

(22) Filed: Feb. 15, 2012

(65) Prior Publication Data

US 2012/0210184 A1    Aug. 16, 2012

Related U.S. Application Data

(60) Provisional application No. 61/443,121, filed on Feb. 15, 2011.

(51) Int. Cl.
*G01R 31/28*  (2006.01)
*G01R 31/3185*  (2006.01)
*G06F 11/267*  (2006.01)
*G01R 31/3177*  (2006.01)
*G06F 11/27*  (2006.01)

(52) U.S. Cl.
CPC ...... *G01R 31/318594* (2013.01); *G06F 11/267* (2013.01); *G01R 31/3177* (2013.01); *G06F 11/27* (2013.01); *G01R 31/318541* (2013.01)
USPC .......................................... 714/731; 714/729

(58) Field of Classification Search
CPC ................... G01R 31/318544; G01R 31/3177; G01R 31/318541; G01R 35/00; G06F 11/267; G06F 11/27

USPC ............ 714/731, 726, 729, 30, E11.155, 724, 714/25

See application file for complete search history.

(56) References Cited

U.S. PATENT DOCUMENTS

| 7,788,561 | B2 * | 8/2010 | Huang et al. .................. 714/729 |
| 8,316,265 | B2 * | 11/2012 | Guo et al. ..................... 714/726 |
| 8,356,218 | B2 * | 1/2013 | Funatsu ......................... 714/726 |
| 2005/0240848 | A1 * | 10/2005 | Cote et al. ...................... 714/726 |
| 2007/0043989 | A1 * | 2/2007 | Yokota .......................... 714/726 |
| 2008/0215943 | A1 * | 9/2008 | Guo et al. ..................... 714/729 |
| 2009/0235134 | A1 * | 9/2009 | Guo et al. ..................... 714/726 |

OTHER PUBLICATIONS

By J.-S. Yang and S.-Y. Huang, "Quick Scan Chain Diagnosis Using Signal Profiling," Proc. Int'l Conf. on Computer Design, 2005.
By Wu-Tung Cheng; Yu Huang, "Enhance Profiling-Based Scan Chain Diagnosis by Pattern Masking", Asian Test Symposium (ATS), 2010 19th IEEE.

* cited by examiner

*Primary Examiner* — Phung M Chung

(57) ABSTRACT

Aspects of the invention relate to techniques for diagnosing compound hold-time faults. A profiling-based scan chain diagnosis may be performed on a faulty scan chain to determine observed scan cell failing probability information and one or more faulty segments based on scan pattern test information. Calculated scan cell failing probability information may then be derived. Based on the calculated scan cell failing probability information and the observed scan cell failing probability information, one or more validated faulty segments are verified to have one or more compound hold-time faults. Finally, one or more clock defect suspects may be identified based on information of the one or more validated faulty segments.

18 Claims, 8 Drawing Sheets

Flow chart 800

Flow chart 800

COMPOUND HOLD-TIME FAULT DIAGNOSIS

RELATED APPLICATIONS

This application claims priority to U.S. Provisional Patent Application No. 61/443,121, entitled "Diagnosis of Compound Hold Faults Caused by Slow Clock Signals," filed on Feb. 15, 2011, and naming Yu Huang et al. as inventors, which application is incorporated entirely herein by reference.

FIELD OF THE INVENTION

The present invention relates to the field of integrated circuit (IC) testing technology. Various implementations of the invention may be particularly useful for diagnosing hold-time faults.

BACKGROUND OF THE INVENTION

Scan-based testing has proven to be a cost-effective method to achieve good test coverage in digital circuits, and hence has been widely adopted in most designs. Traditionally, if a circuit fails a test, physical failure analysis (PFA) and yield learning techniques are used to locate root causes of the failure. However, advances in semiconductor technologies and increasing complexity of designs are rendering this approach inadequate. Scan-based diagnosis can help to guide PFA to focus on chip areas where defects are likely to be found and thus speedup yield ramp-up processes.

Scan-based diagnosis techniques can be divided into three categories: system logic diagnosis, scan chain diagnosis, and compound fault diagnosis. The system logic diagnosis assumes that defects reside in the circuit under test while scan chains work correctly. The scan chain diagnosis, on the other hand, assumes only scan chains may be problematic. As its name indicates, the compound fault diagnosis tries to locate defect suspects in both scan chains and the circuit under test.

All the three categories of scan-based diagnosis techniques have developed various hold-time fault models. In the system logic diagnosis, the hold-time fault models have been built around source scan cells, sink scan cells, the paths connecting the source and sink scan cells, or clock trees. These fault models are not suitable for either scan chain hold-time fault diagnosis or compound hold-time fault diagnosis. Some of the scan chain hold-time diagnosis techniques may locate the scan cell(s) that suffer hold-time fault(s) during scan chain shift. However, they cannot discern whether the real root cause is on the scan chain or clock. While some other of the scan chain hold-time diagnosis techniques may diagnose scan chain stuck-at faults caused by clock defects, they cannot be applied directly to diagnose slow clock faults. It has been found that compound hold-time faults are often caused by defects is in the global control signals such as the clock signals. These defects cannot be located by simply running any conventional compound fault diagnosis procedures.

BRIEF SUMMARY OF THE INVENTION

Aspects of the invention relate to techniques for diagnosing compound hold-time faults. Compound hold-time faults may be caused by spot delay defects on a clock tree. With various implementations of the invention, a profiling-based scan chain diagnosis may be performed on a faulty scan chain to determine observed scan cell failing probability information and one or more faulty segments based on scan pattern test information. The faulty scan chain may be identified by analyzing test response data for chain patterns. An automatic test equipment (ATE) may be used to apply chain patterns to a circuit. A chain pattern is a test pattern that is usually used only in shift-in and shift-out operations. Chain patterns may be used to test the integrity of scan chains. In addition to the identification of faulty scan chains, information about types and perhaps numbers of faults (e.g., compound hold-time faults) on each of the faulty scan chains may also be determined based on the analysis of test response data for chain patterns. The scan pattern test information used by the profiling-based scan chain diagnosis comprises test response data for scan patterns. These test response data may be obtained also by using the ATE to apply scan patterns to the circuit. A scan pattern is a test pattern that is used not only in shift-in and shift out operations, but also in capture operations. The system logic of the circuit may be checked by scan patterns.

After the one or more faulty segments are identified, calculated scan cell failing probability information may be derived. This operation may comprise: masking bits of the scan patterns corresponding to scan cells of which loading values may be corrupted during a loading process; determining potential source cells for each of scan cells in the one or more faulty segments using critical path tracing; determining transitional probability information of the potential source cells; and determining calculated scan cell failing probability for the one or more faulty segments based on the transitional probability information.

Based on the calculated scan cell failing probability information and the observed scan cell failing probability information, one or more validated faulty segments are verified to have one or more compound hold-time faults. Based on information of the one or more validated faulty segments, one or more clock defect suspects may be identified. Backward and forward tracing may be employed for this identification process.

DETAILED DESCRIPTION OF THE INVENTION

General Considerations

Various aspects of the present invention relate to diagnosing compound hold-time faults. In the following description, numerous details are set forth for the purpose of explanation.

However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform," "derive," "determine," and "verify" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
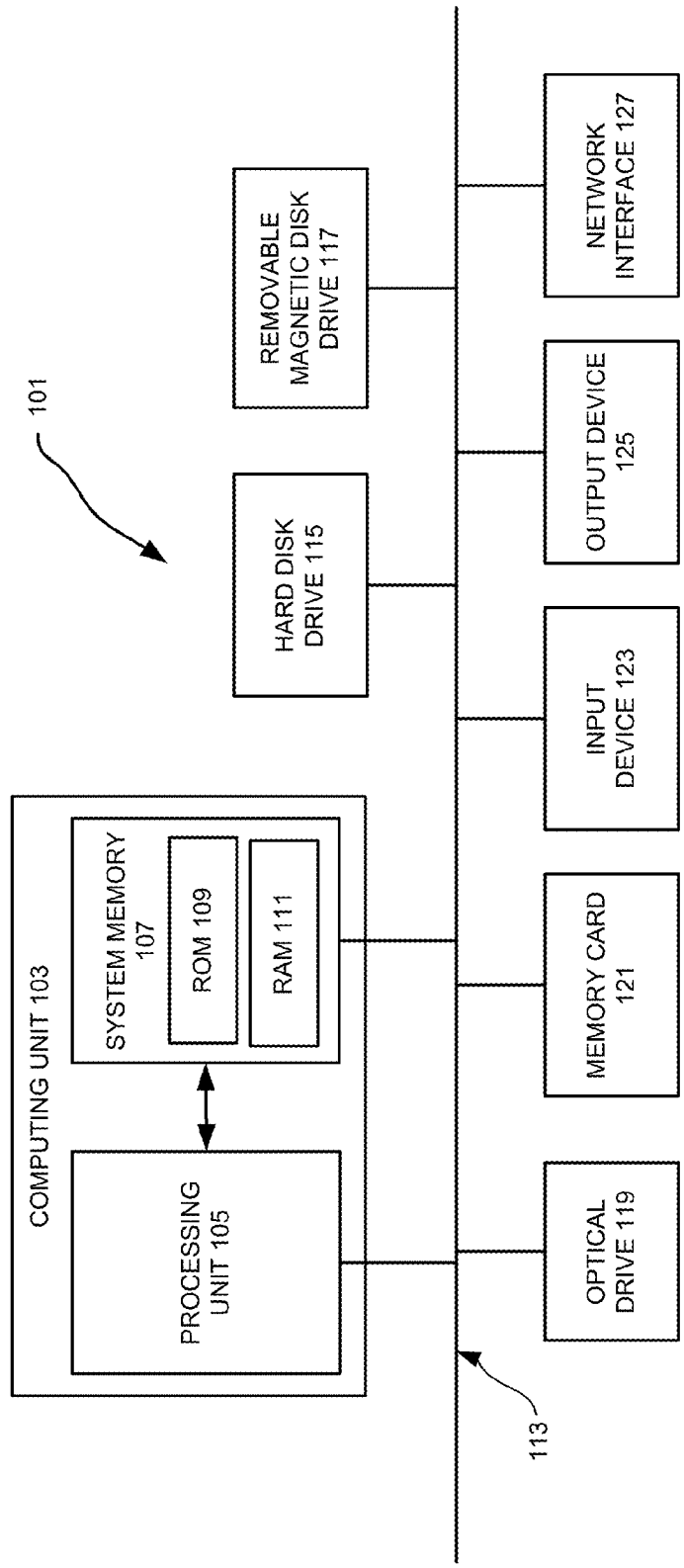
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Slow Clock Fault Behaviors

Figure 2:
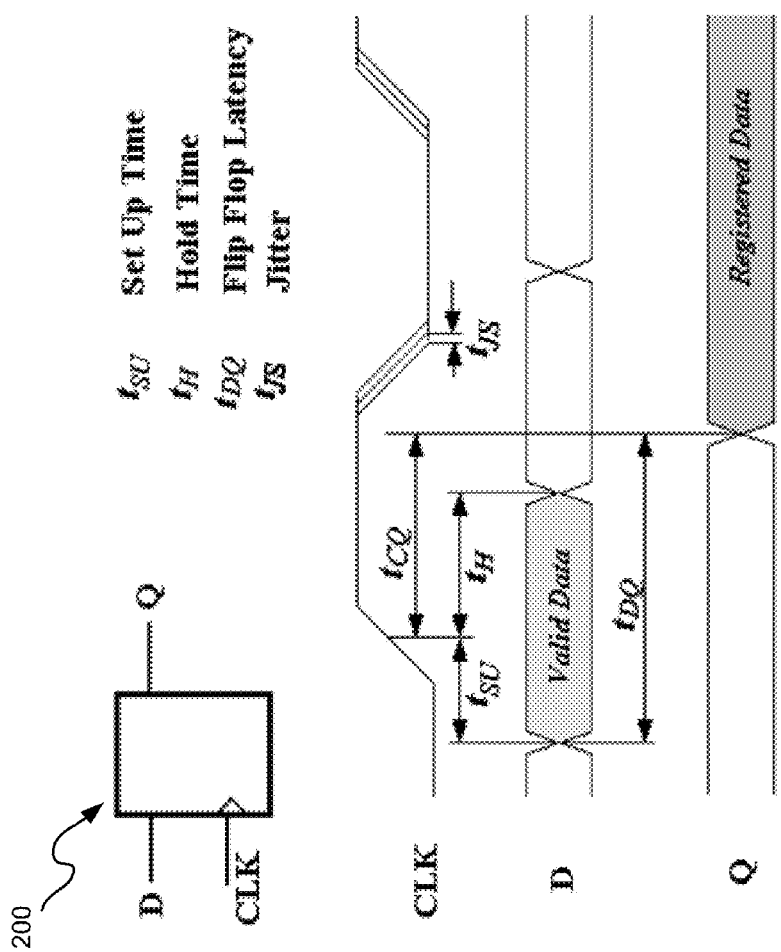
FIG. 2 illustrates a timing diagram for a flip-flop.

A timing diagram for a flip-flop 200 is illustrated in FIG. 2. The timing diagram shows that the signal at the input D of the flip-flop 200 can be correctly registered to its output Q only if it is maintained for at least a specified hold-time period ($t_H$) after the clock is active. If this hold-time requirement is not satisfied, the registered signal may be incorrect.

Figure 3:
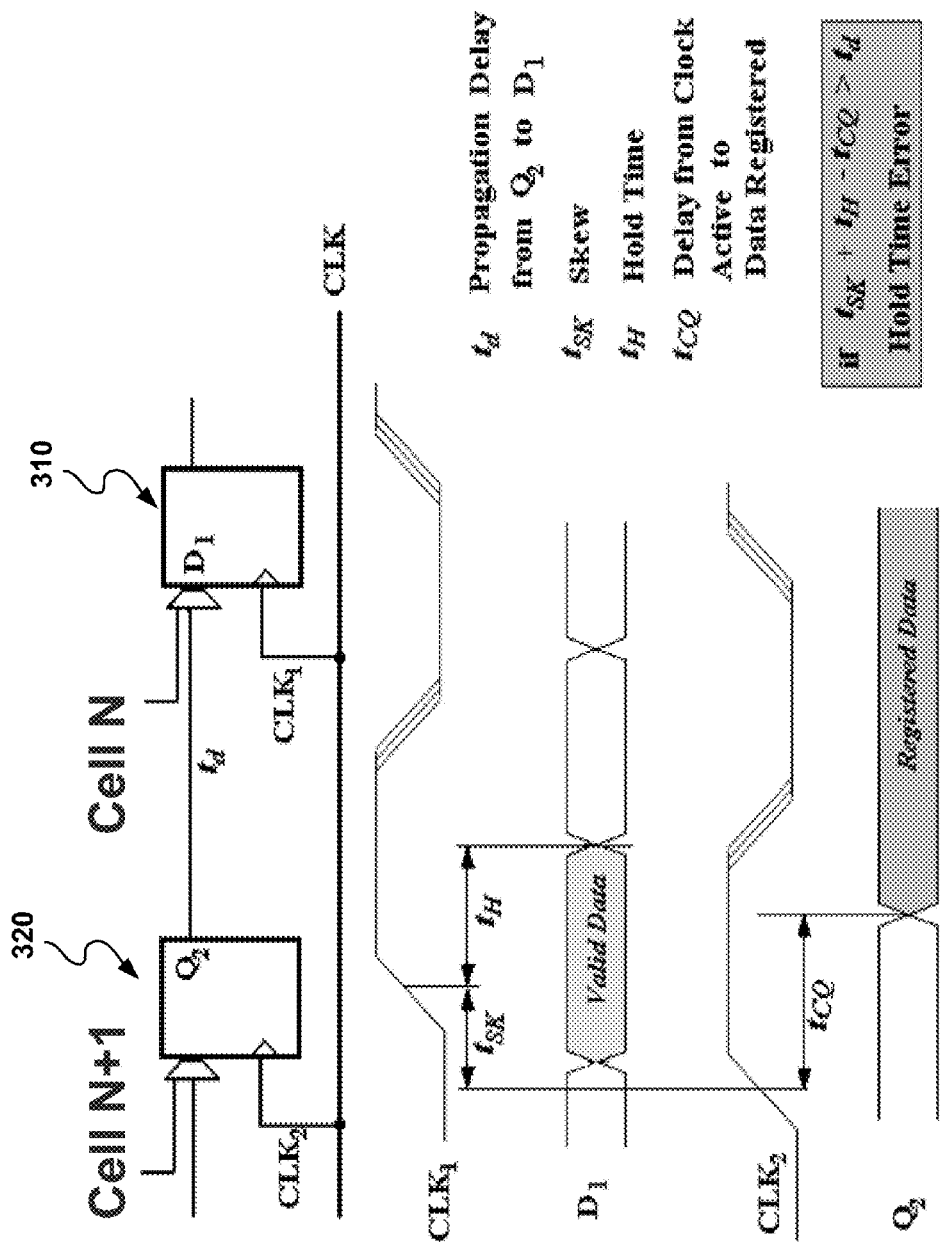
FIG. 3 illustrates an example of two connected flip-flops serving as two consecutive scan cells on a scan chain along with a corresponding timing diagram.

FIG. 3 illustrates an example of two flip-flops 310 and 320 serving as two consecutive scan cells, cell N and cell N+1, respectively, on a scan chain along with a corresponding timing diagram. In the timing diagram, a slow-clock signal ($CLK_1$) drives cell N and a normal clock ($CLK_2$) drives cell N's immediate upstream scan cell (cell N+1). Without losing generality, the scan cell connected to the scan-output is numbered 0 and the scan cells in the chain are numbered incrementally from scan-output to scan-input sequentially. Based on this timing diagram, a hold-time fault could be introduced if $t_{SK}+t_H-t_{CQ}>t_d$, where $t_{SK}$ is the clock skew between $CLK_1$ and $CLK_2$, $t_H$ is the required hold time, $t_{CQ}$ is the delay from activating clock to registering data for the driving scan cell N+1 and $t_d$ is the propagation delay from the output of cell N+1 ($Q_2$) to the input of cell N ($D_1$). That is, when a clock signal for one scan cell is delayed enough to satisfy the above inequality, it may introduce a hold-time fault on the scan chain between this scan cell and its immediate upstream scan cell.

Figure 4:
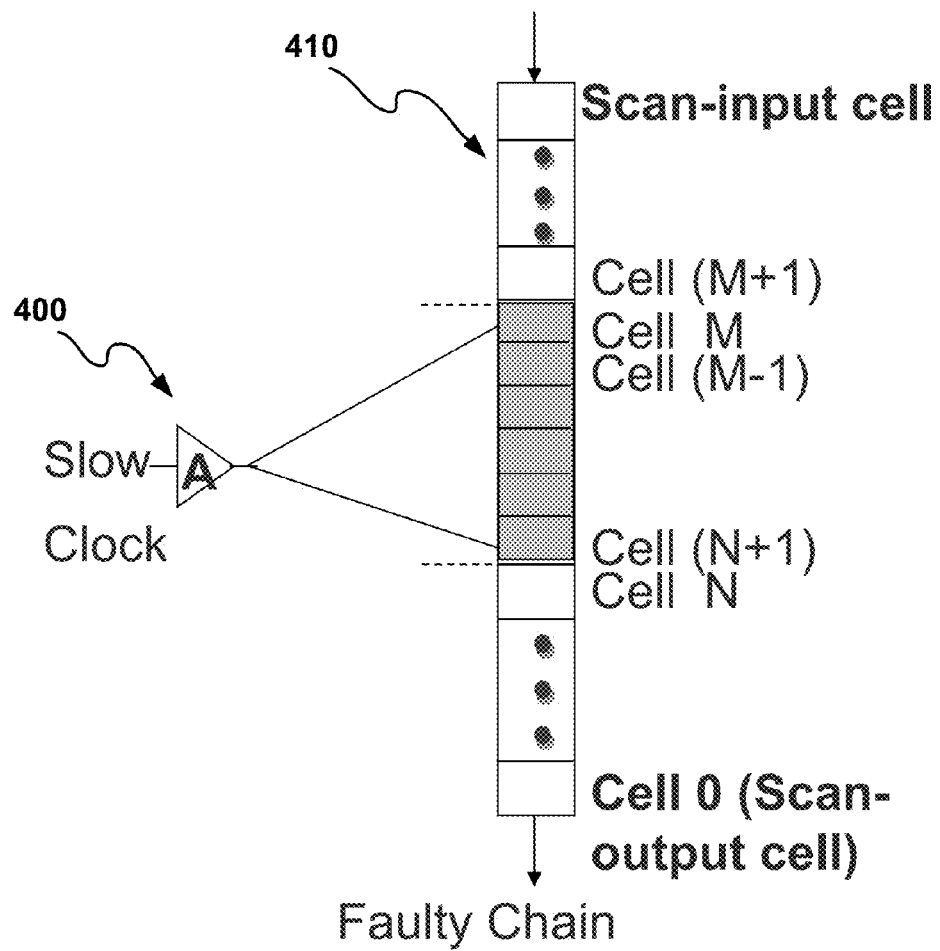
FIG. 4 illustrates an example of a segment of consecutive scan cells on a faulty scan chain driven by a slow clock signal.

FIG. 4 illustrates an example in which a segment of consecutive scan cells (cell M to Cell (N+1)) on a faulty scan chain 410 is driven by a slow clock signal 400. All other scan cells (scan-input cell–cell M+1, and cell N–cell 0 (scan-output cell)) on the faulty scan chain 410 are driven by normal clock signals. In this example, the scan chain hold time fault may only happen between cell (M+1) and cell M even though cells M to N+1 are all driven by the slow clock signal 400. This is because cell M has a delayed clock compared to the clock driving cell (M+1). The cells M to N+1, on the other hand, share the same "delayed clock", and thus do not lead to hold-time faults between them. This behavior is quite different from a clock defect that causes scan cell stuck-at faults. For a stuck-at fault, every scan cell will be impacted by the defective clock.

Sometimes, a slow clock signal may drive N (N>1) segments of scan cells on a scan chain. This scan chain may show up to N hold-time faults. The number of hold-time observed usually does not correlate with the number of consecutive scan cells in each of the segments.

Figure 5:
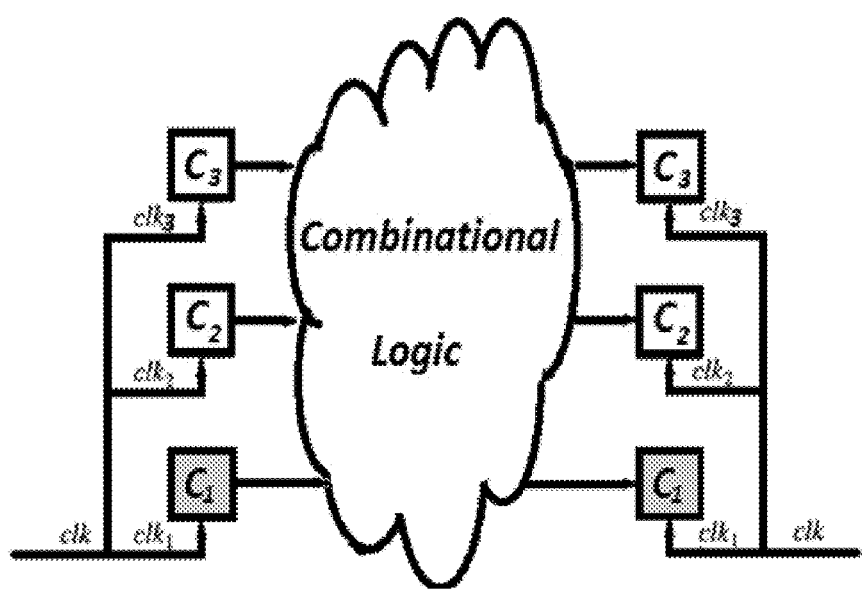
FIG. 5 illustrates an example of a hold-time fault caused by system logic paths.

Similar to scan chain hold time illustrated in FIG. 3, hold-time faults may be caused by system logic path(s) driven by a slow clock signal during the capture mode. FIG. 5 illustrates such an example in which $clk_1$ is a slow clock signal while $clk_2$ and $clk_3$ are normal clock signals. During the first capture cycle, scan cell $C_1$ may capture an incorrect value due to hold time fault caused by its slow clock, if some of its source cells (e.g. $C_2$ and $C_3$) have transitions at their Q that can be propagated to data input of $C_1$. For test patterns with multiple capture cycles, the incorrect value captured at $C_1$ may be propagated, during the remaining capture cycles, to cells that may or may not be driven by the slow clock. Because multiple sink cells could exist due to a slow clock and each sink cell may be driven by multiple source cells, using traditional simulation-based hold-time fault diagnosis may not be an effective solution. Diagnosis methods according to embodiments of the present invention may nonetheless be effective in many situations due to the use of profiling-based techniques employed.

If a slow clock is involved in both the shift and capture modes of a scan-based test, compound hold-time faults should be used as fault models. Taking both of scan chain hold-time faults and system logic hold-time faults into consideration, the compound hold-time fault behavior is more complicated. In the capture mode, a sink cell could be driven by some source cells that may be on the faulty chain themselves. In the shift mode, the captured values may change its sensitivity to the hold-time faults on scan chains. Thus, it is not easy to model compound hold-time faults directly.

Profiling-Based Scan Chain Diagnosis

As it is difficult to directly model compound hold-time faults caused by a slow clock defect, chain diagnosis may be performed first and defective clock signals may then be located from the identified faulty scan cells. With various implementations of the invention, profiling-based chain diagnosis methods may be employed for the chain diagnosis. One profiling-based diagnosis method is discussed in a paper authored by J.-S. Yang and S.-Y. Huang, "Quick Scan Chain Diagnosis Using Signal Profiling," *Proc. Int'l Conf on Computer Design,* 2005, pp. 157-160, which is incorporated herein by reference. This method uses functional patterns or special diagnostic ATPG patterns for chain diagnosis. In a practical chain diagnosis application, existing manufacturing ATPG patterns are often preferred for diagnosis. If the diagnosis results from applying the existing manufacturing ATPG patterns are not satisfactory, additional special diagnostic patterns may be created.

Another profiling-based chain diagnosis method is disclosed in U.S. patent application Ser. No. 13/158,743, entitled "Profiling-Based Scan Chain Diagnosis," filed on Jun. 13, 2011, and naming Yu Huang et al. as inventors, which application is incorporated entirely herein by reference. This method employs data-driven techniques and manufacturing ATPG scan patterns. Some implementations of the method comprise five operations. In the first operation, chain patterns are used to identify fault chain(s) and fault model of each faulty chain. Based on results for chain patterns, one or more scan chains with hold-time fault(s) may be determined. To simplify the discussion, one faulty scan chain is assumed to be identified.

In the second operation, all sensitive bits in the loading values for each scan pattern are X-masked. A sensitive bit is a bit in a test pattern of which the value that may be changed after the test pattern is loaded to scan chains (i.e. after a scan chain shift operation). For different fault models, the sensitive bits may be different. The following is an X-masking example. A scan pattern has a good machine loaded value 001110011010 on a faulty chain. If a hold-time fault is identified in the first operation, all transition bits will become sensitive bits, and the loaded value will be modified as X̲0X̲11X̲X̲0X̲1X̲X̲X̲.

In the third operation, the X-masked scan patterns are simulated to determine, for the faulty scan chain, the good circuit captured value, Sen(i) and Fail(i). The good circuit captured value is a value captured by the faulty scan chain if the circuit under test including scan chains has no defect. Sen(i) is the number of scan patterns that cell i on the faulty scan chain captures a sensitive bit. For circuit with embedded compactors, Sen(i) is the number of scan patterns that cell i on the faulty scan chain captures a sensitive bit (a binary value at cycle i on the faulty channel after compaction). Fail(i) is the number of times that Sen(i) failed according to observed test results.

In the fourth operation, a scan cell failing probability (or failing probability), $P_{fail}(i)$, is determined for cell i on the faulty scan chain. The failing probability may be calculated by $P_{fail}(i)=Fail(i)/Sen(i)$, when Sen(i) is not 0. In case Sen(i) is 0, $P_{fail}(i)$ will be interpolated based on the value of $P_{fail}(i-1)$ and $P_{fail}(i+1)$. A drastic change of $P_{fail}$ may be observed between the downstream cells of a defective cell and the upstream cells of the defective cell. Accordingly, with some implementations of the invention, a differential failing probability, denoted as $Diff_{fail}(i)=|P_{fail}(i)-P_{fail}(i-1)|$ may be determined for each cell, except cell 0. As such, $Diff_{fail}(i)$ may reach a maximum value at or next to the faulty scan cell.

In the fifth operation, the defect location may be determined based on failing probabilities or differential failing probabilities. While the defective scan cell may be ideally located, for example, by finding a maximum value in the differential failing probabilities, results from real test data may not lead to a clear identification due to noises. The noises may come from many sources, including: 1) Discrepancy between a fault model and un-modeled realistic defects, 2) Compound defects that cannot be easily modeled, 3) Errors introduced into fail log, during fail log generation/translation/ATE truncation, 4) Imprecision/Inaccuracy of simulations procedures in EDA tools, and 5) Unrepeatable test results due to transient effect/testing environment changes. To filter out the noises, an adaptive feedback noise filtering system may be applied to estimate the maximum $Diff_{fail}$ among cells and rank defective cell candidates.

Figure 6:
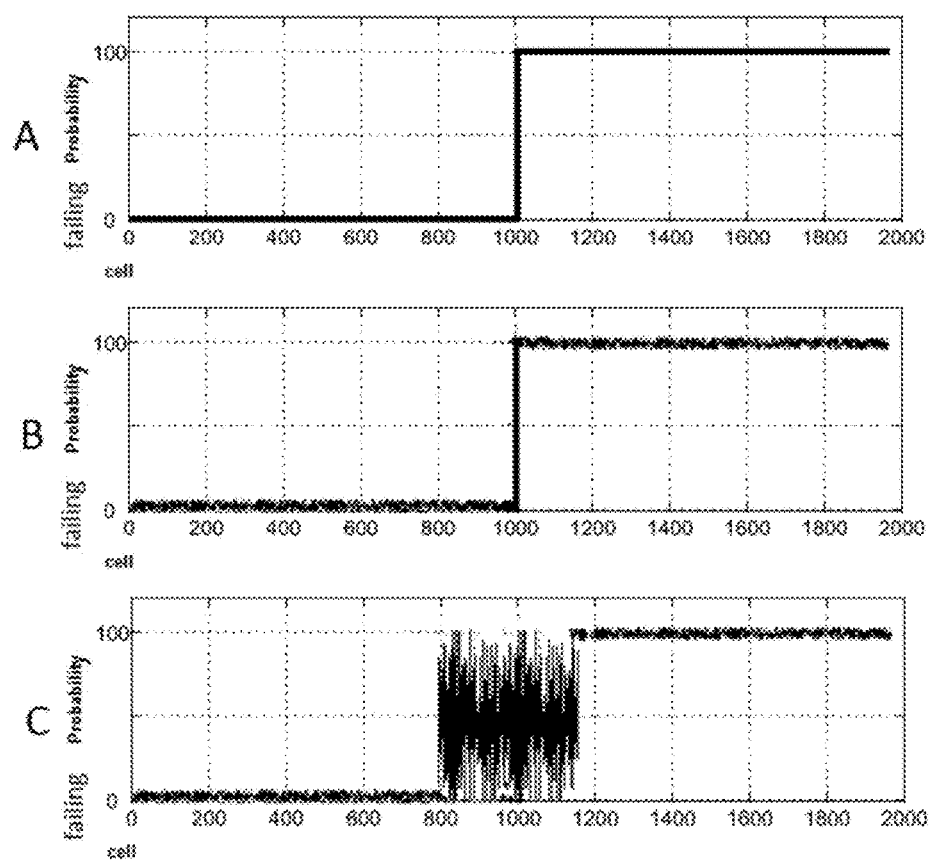
FIG. 6 illustrates an example of three failing probability curves (A, B, and C) obtained under three conditions for a faulty scan chain.

FIG. 6 illustrates an example of three failing probability curves (A, B, and C) obtained under three conditions for a faulty scan chain. The curve A, an ideal profiling plot for a permanent chain fault, has a failing probability of zero for the cells in the downstream of cell 1000 and a failing probability of 100% for the cells in the upstream of cell 1000. Based on the curve A, cell 1000 can be easily identified as the defect location. Even though the curve B shows small "noises," the noises are sufficiently small that the defective cell 1000 may also be located with accuracy. The inspection of the curve C, however, does not lead to a clear identification of a defective cell as relatively large noises are observed for a segment of scan cells (failing probability values varying from 10%-90%). The curve C may be an indication of compound hold-time faults caused by a slow-clock defect. The large "noise" in the middle range is likely to be caused by the hold-time faults during the capture mode. This type of faults may be diagnosed using diagnosis methods according to various embodiments of the invention discussed below.

Compound Hold-Time Fault Diagnosis Tools and Methods

Figure 7:
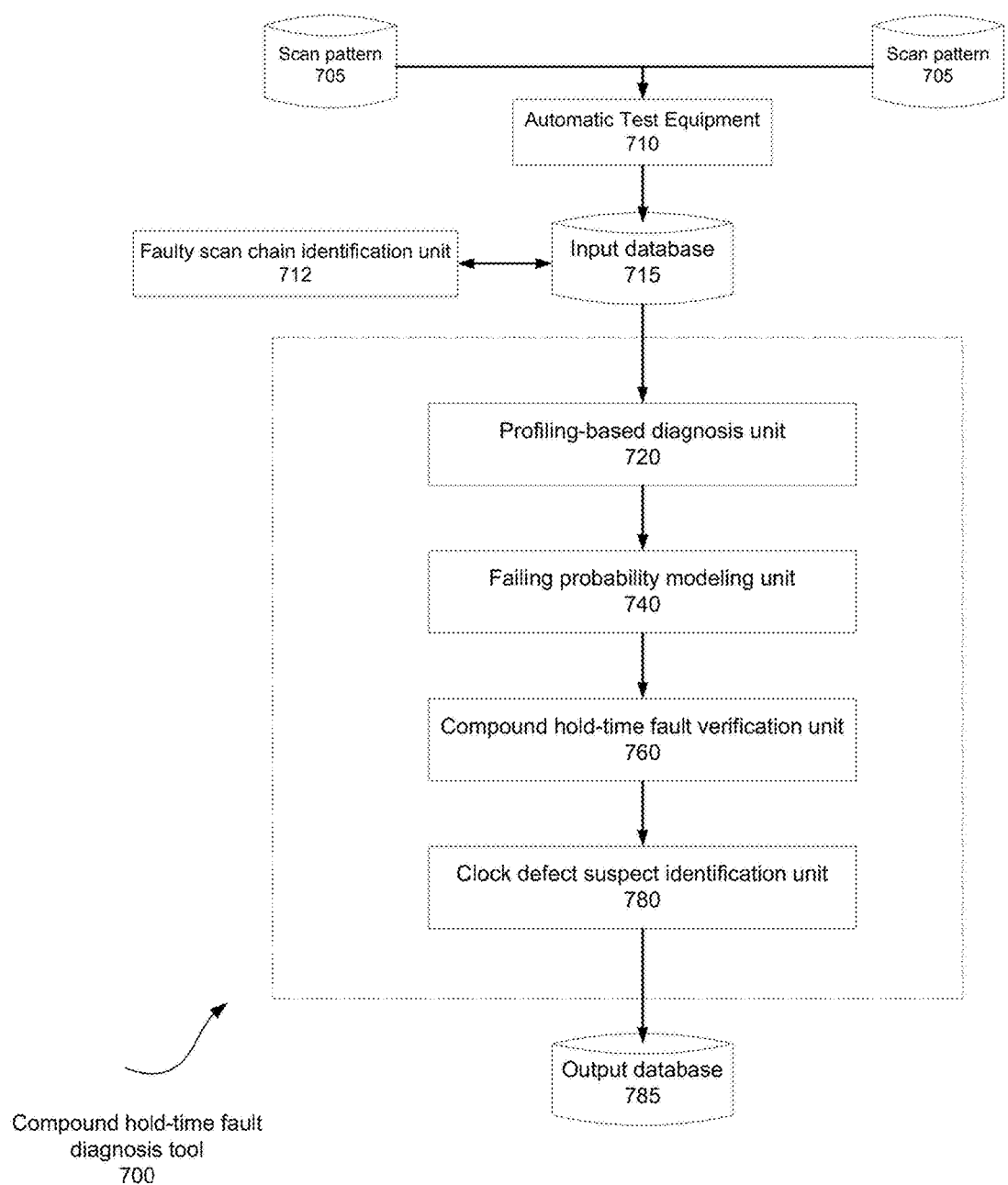
FIG. 7 illustrates an example of a compound hold-time fault diagnosis tool according to various embodiments of the invention.

FIG. 7 illustrates an example of a compound hold-time fault diagnosis tool according to various embodiments of the invention. As seen in the figure, the compound hold-time fault diagnosis tool 700 includes four units: a profiling-based diagnosis unit 720, a failing probability modeling unit 740, a compound hold-time fault verification unit 760, and a clock defect suspect identification unit 780. As will be discussed in more detail below, some implementations of the compound hold-time fault diagnosis tool 700 may cooperate with (or incorporate) one or more of a faulty scan chain identification unit 712, an input database 715 and an output database 785. While the input database 715 and the output database 785 are shown as separate units in FIG. 7, a single data storage medium may be used to implement some or all of these databases.

According to some embodiments of the invention, one or more of the profiling-based diagnosis unit 720, the failing probability modeling unit 740, the compound hold-time fault verification unit 760, the clock defect suspect identification unit 780, and the faulty scan chain identification unit 712 may be implemented by executing programming instructions on one or more programmable computers/computer systems, such as the computing system illustrated in FIG. 1. Correspondingly, some other embodiments of the invention may be implemented by software instructions, stored on a non-transitory computer-readable medium, for instructing one or more programmable computers/computer systems to perform the functions of one or more of the profiling-based diagnosis unit 720, the failing probability modeling unit 740, the compound hold-time fault verification unit 760, the clock defect suspect identification unit 780, and the faulty scan chain identification unit 712. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 8:
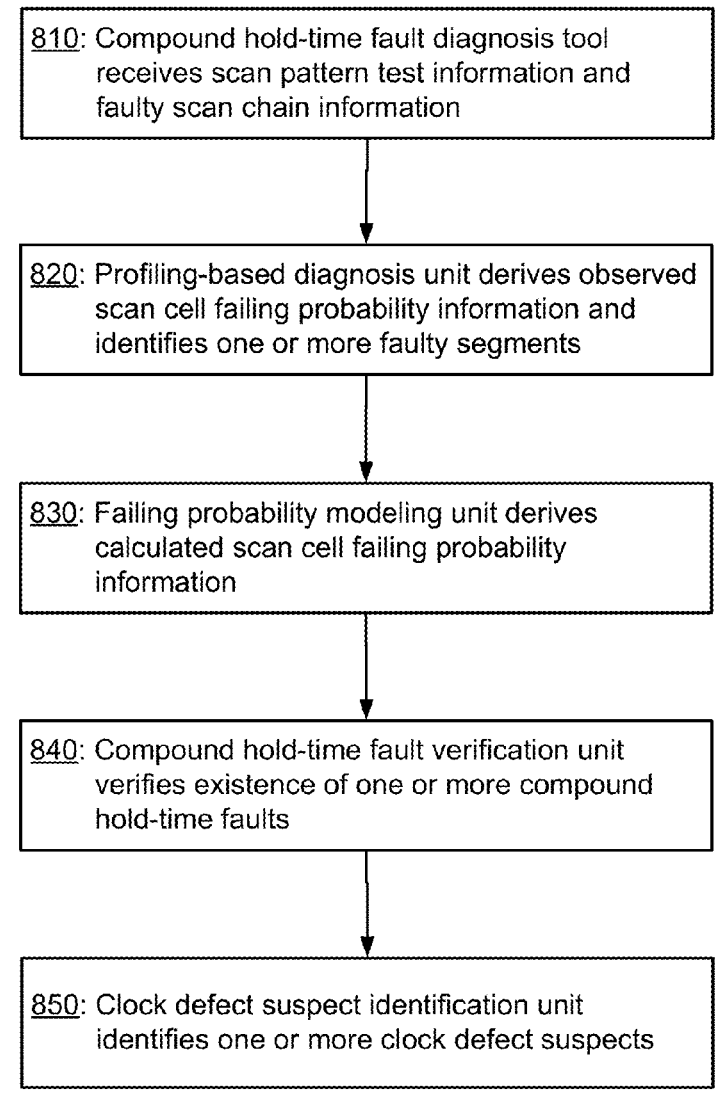
FIG. 8 illustrates a flowchart describing compound hold-time fault diagnosis methods that may be employed by various embodiments of the invention.

For ease of understanding, compound hold-time fault diagnosis methods that may be employed according to various embodiments of the invention will be described with reference to the compound hold-time fault diagnosis tool 700 illustrated in FIG. 7 and the method for compound hold-time fault diagnosis shown in the flow chart 800 in FIG. 8. It should be appreciated, however, that alternate implementations of a compound hold-time fault diagnosis tool may be used to perform the method for compound hold-time fault diagnosis shown in the flow chart 800 according to various embodiments of the invention. In addition, it should be appreciated that implementations of the compound hold-time fault diagnosis tool 700 may be employed with other methods for compound hold-time fault diagnosis according to different embodiments of the invention.

Initially, in operation 810, the compound hold-time fault diagnosis tool 700 receives scan pattern test information and faulty scan chain information. The scan pattern test information comprises test response data for scan patterns collected by a tester such as ATE. The faulty scan chain identification unit 712 may be employed to obtain the faulty scan chain information based on test response data for chain patterns. The faulty scan chain information may comprise identifies of one or more faulty scan chains and types of faults for each of the one or more faulty scan chains. Without losing generality, one faulty scan chain with one or more hold-time faults is assumed to be identified for the following description.

Next, in operation 820, the profiling-based diagnosis unit 720 derives observed scan cell failing probability information for the faulty scan chain and identifies one or more faulty segments on the faulty scan chain. Various profiling-based diagnosis methods may be employed by the profiling-based diagnosis unit 720. One such method is the five-operation method discussed in the previous section. It should be noted that not all of the five operations need to be performed by the profiling-based diagnosis unit 720.

Moreover, rather than searching for one sharp change of $P_{fail}(i)$, the profiling-based diagnosis unit 720 may identify each of the one or more faulty segments based on two neighboring sharp changes. The curve C in FIG. 6, for example, shows two sharp changes of the failing probabilities near scan cells 800 and 1150, respectively. The exact scan cell for the two sharp changes are denoted as cell N and cell M. As shown in the figure, the failing probabilities for scan cells between cells 0 and N are less than 10%, the failing probabilities for scan cells between cells N+1 and M oscillate between 1 and 0, and the failing probabilities for scan cells above cell M are greater than 90%. Accordingly, the profiling-based diagnosis unit 720 may identify one faulty segment for the faulty scan chain associated with the curve C in FIG. 6.

If the failing probabilities between cells 0 and N are not smaller than a first predetermined value (i.e., 10%), the profiling-based diagnosis unit 720 may stop the process and report chain hold-time fault between cell (N+1) and cell N. Similarly, if the failing probabilities between cell (M+1) and the scan-input cell are not greater than a second predetermined value (i.e., 90%), the profiling-based diagnosis unit 720 may also stop the process and report a chain hold-time fault between cell (N+1) and cell N.

In operation 830, the failing probability modeling unit 740 derives calculated scan cell failing probability information for the identified one or more faulty segments. The curve C is used as an example to illustrate the operation. First, the failing probability modeling unit 740 x-masks cells from 0 to M for each scan pattern, since these cells' loading values may be corrupted during a loading process. For each sink cell, between cell M and cell (N+1), the failing probability modeling unit 740 then determines potential source cells by critical path tracing. Next, the failing probability modeling unit 740 determines transitional signal probabilities for the potential source cells. Based on the transitional signal probabilities, the failing probability modeling unit 740 determines calculated scan cell failing probability for the one or more faulty segments. This final determination process may be performed by assuming each source cell's transition has the same contribution to the corresponding sink cell.

In operation 840, the compound hold-time fault verification unit 760 verifies existence of one or more compound hold-time faults associated with one or more validated faulty segments based on the calculated scan cell failing probability information and the observed scan cell failing probability information. With various implementations of the invention, correlation between the calculated failing probabilities and the observed failing probabilities is determined. For example, the method of least squares may be employed by the compound hold-time fault verification unit 760. If the correlation value for a faulty segment is above a certain threshold (e.g., 80%), that segment is validated as having a compound hold-time fault and is referred to as a validated faulty segment.

In operation 850, the clock defect suspect identification unit 780 identifies one or more clock defect suspects based on the one or more validated faulty segments. With some implementations of the invention, the clock defect suspect identification unit 780 may first traces backward on a clock tree from scan cells in the one or more validated faulty segments. Then, a union for each of the one or more validated faulty segments and an intersection of unions for the one or more validated faulty segments may be determined. For a validated faulty segment r, the union $U_r$ may be derived using the equation, $U_r = \cup_{(all\ cell\ i\ in\ range\ r)} C_i$ where $C_i$ is a clock node on the clock tree that drives scan cell i. The intersection I among the unions may be derived using the equation, $I = \cap_{(all\ range\ r\ on\ all\ faulty\ chains)} U_r$. Finally, one or more clock defect suspects may be determined by tracing forward on the clock tree from nodes in the intersection I.

The nodes in set I may be ordered based on its depth in the clock tree. The forward tracing may be performed one node at a time according to its order in I. If a node also drives at least one scan cell on a good chain, it may not be a suspect. The same is true for all its parent and ancestor nodes on the clock tree if any of them are in I. These nodes may be deleted from I. The searching order of I may avoid any unnecessary forward trace from higher level nodes. A clock defect suspect may be defined as those satisfying the conditions (a) drive at least one scan cell in each validated faulty segment and (b) don't drive any cell on good chains.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of compound hold-time fault diagnosis, comprising:
   receiving scan pattern test information and faulty scan chain information, the scan pattern test information comprising test response data for scan patterns, the faulty scan chain information comprising information of a scan chain having one or more hold-time faults;
   performing a profiling-based scan chain diagnosis on the scan chain to determine observed scan cell failing probability information and one or more faulty segments based on the scan pattern test information;
   deriving calculated scan cell failing probability information for the one or more faulty segments; and
   verifying existence of one or more compound hold-time faults associated with one or more validated faulty segments based on the calculated scan cell failing probability information and the observed scan cell failing probability information.

2. The method recited in claim 1, further comprising:
   identifying one or more clock defect suspects based on information of the one or more validated faulty segments.

3. The method recited in claim 2, wherein the identifying comprises:
   tracing backward on a clock tree from scan cells in the one or more validated faulty segments;
   determining a union for each of the one or more validated faulty segments and an intersection of unions for the one or more validated faulty segments; and
   tracing forward on the clock tree from nodes in the intersection.

4. The method recited in claim 2, wherein the one or more clock defect suspects are clock signals each of which drives at least one scan cell in each of the one or more validated faulty segments and drives no scan cells on good scan chains.

5. The method recited in claim 1, wherein the information of a scan chain having one or more hold-time faults is obtained based on test response data for chain patterns.

6. The method recited in claim 1, wherein the performing a profiling-based scan chain diagnosis comprises:
   masking sensitive bits of the scan patterns;
   simulating masked scan patterns;
   determining observed scan cell failing probability information; and
   identifying one or more faulty segments.

7. The method recited in claim 1, wherein the deriving calculated scan cell failing probability information comprises determining source cells for each of the scan cells in the one or more faulty segments.

8. The method recited in claim 1, wherein the deriving calculated scan cell failing probability information comprises
   masking bits of the scan patterns corresponding to scan cells of which loading values may be corrupted during a loading process;
   determining potential source cells for each of scan cells in the one or more faulty segments using critical path tracing;
   determining transitional probability information of the potential source cells; and
   determining calculated scan cell failing probability for the one or more faulty segments based on the transitional probability information.

9. The method recited in claim 1, wherein the verifying existence of one or more compound hold-time faults comprises:
   determining correlation information between the calculated scan cell failing probability information and the observed scan cell failing probability information.

10. A non-transitory processor-readable medium storing processor-executable instructions for causing one or more processors to perform a method of compound hold-time fault diagnosis, the method comprising:
    receiving scan pattern test information and faulty scan chain information, the scan pattern test information comprising test response data for scan patterns, the faulty scan chain information comprising information of a scan chain having one or more hold-time faults;
    performing a profiling-based scan chain diagnosis on the scan chain to determine observed scan cell failing probability information and one or more faulty segments based on the scan pattern test information;
    deriving calculated scan cell failing probability information for the one or more faulty segments; and
    verifying existence of one or more compound hold-time faults associated with one or more validated faulty segments based on the calculated scan cell failing probability information and the observed scan cell failing probability information.

11. The non-transitory processor-readable medium recited in claim 10, wherein the method further comprises:
   identifying one or more clock defect suspects based on information of the one or more validated faulty segments.

12. The non-transitory processor-readable medium recited in claim 11, wherein the identifying comprises:
   tracing backward on a clock tree from scan cells in the one or more validated faulty segments;
   determining a union for each of the one or more validated faulty segments and an intersection of unions for the one or more validated faulty segments; and
   tracing forward on the clock tree from nodes in the intersection.

13. The non-transitory processor-readable medium recited in claim 11, wherein the one or more clock defect suspects are clock signals each of which drives at least one scan cell in each of the one or more validated faulty segments and drives no scan cells on good scan chains.

14. The non-transitory processor-readable medium recited in claim 10, wherein the information of a scan chain having one or more hold-time faults is obtained based on test response data for chain patterns.

15. The non-transitory processor-readable medium recited in claim 10, wherein the performing a profiling-based scan chain diagnosis comprises:
   masking sensitive bits of the scan patterns;
   simulating masked scan patterns;
   determining observed scan cell failing probability information; and
   identifying one or more faulty segments.

16. The non-transitory processor-readable medium recited in claim 10, wherein the deriving calculated scan cell failing probability information comprises determining source cells for each of the scan cells in the one or more faulty segments.

17. The non-transitory processor-readable medium recited in claim 10, wherein the deriving calculated scan cell failing probability information comprises
   masking bits of the scan patterns corresponding to scan cells of which loading values may be corrupted during a loading process;
   determining potential source cells for each of scan cells in the one or more faulty segments using critical path tracing;
   determining transitional probability information of the potential source cells; and
   determining calculated scan cell failing probability for the one or more faulty segments based on the transitional probability information.

18. The non-transitory processor-readable medium recited in claim 10, wherein the verifying existence of one or more compound hold-time faults comprises:
   determining correlation information between the calculated scan cell failing probability information and the observed scan cell failing probability information.

* * * * *